(12) United States Patent
Hu

(10) Patent No.: US 12,315,788 B1
(45) Date of Patent: May 27, 2025

(54) SEMICONDUCTOR SUBSTRATE AND MANUFACTURING METHOD THEREOF

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

(21) Appl. No.: 18/824,948

(22) Filed: Sep. 5, 2024

Related U.S. Application Data

(60) Provisional application No. 63/640,210, filed on Apr. 30, 2024.

(51) Int. Cl.
*H01L 23/498* (2006.01)
*H01L 21/48* (2006.01)

(52) U.S. Cl.
CPC ...... *H01L 23/49827* (2013.01); *H01L 21/486* (2013.01); *H01L 23/49816* (2013.01)

(58) Field of Classification Search
CPC ............ H01L 23/49827; H01L 21/486
See application file for complete search history.

(56) References Cited

U.S. PATENT DOCUMENTS

| | | | |
|---|---|---|---|
| 2017/0018492 A1* | 1/2017 | Imayoshi | H01L 23/49866 |
| 2023/0091666 A1* | 3/2023 | Duong | H01G 4/33 |
| | | | 174/260 |
| 2024/0312797 A1* | 9/2024 | Sawadaishi | H05K 3/007 |

* cited by examiner

*Primary Examiner* — Evan G Clinton
(74) *Attorney, Agent, or Firm* — JCIPRNET

(57) ABSTRACT

A semiconductor substrate includes a first structure and a second structure. The first structure includes a circuit layer and a vertical conductive connector. The second structure includes a glass layer and an adhesive layer. The vertical conductive connector is landing on the circuit layer. The glass layer includes a through hole bigger than the vertical conductive connector. The vertical conductive connector of the first structure is assembled in the through hole of the second structure and electrically connected to the circuit layer. The adhesive layer is bonded between the glass layer and the circuit layer. A manufacturing method of a semiconductor substrate is also provided.

20 Claims, 18 Drawing Sheets

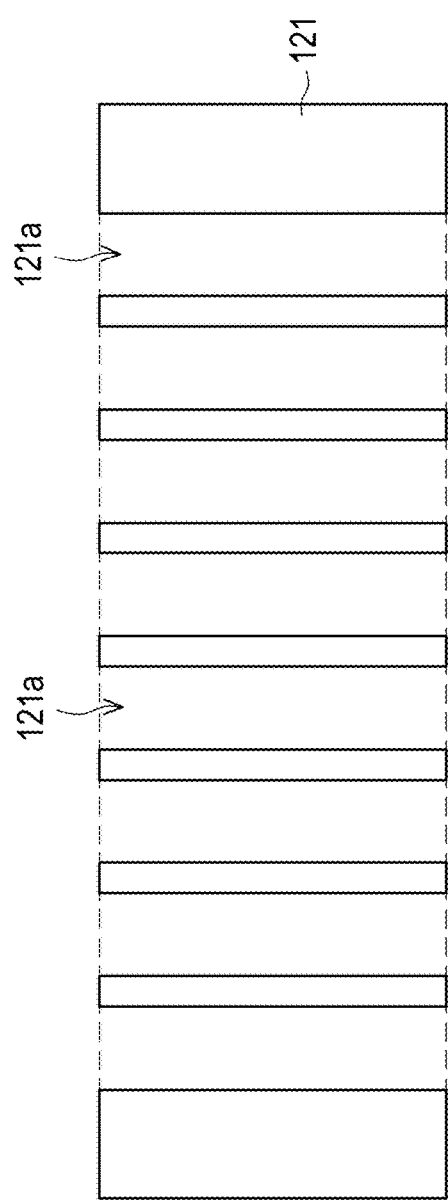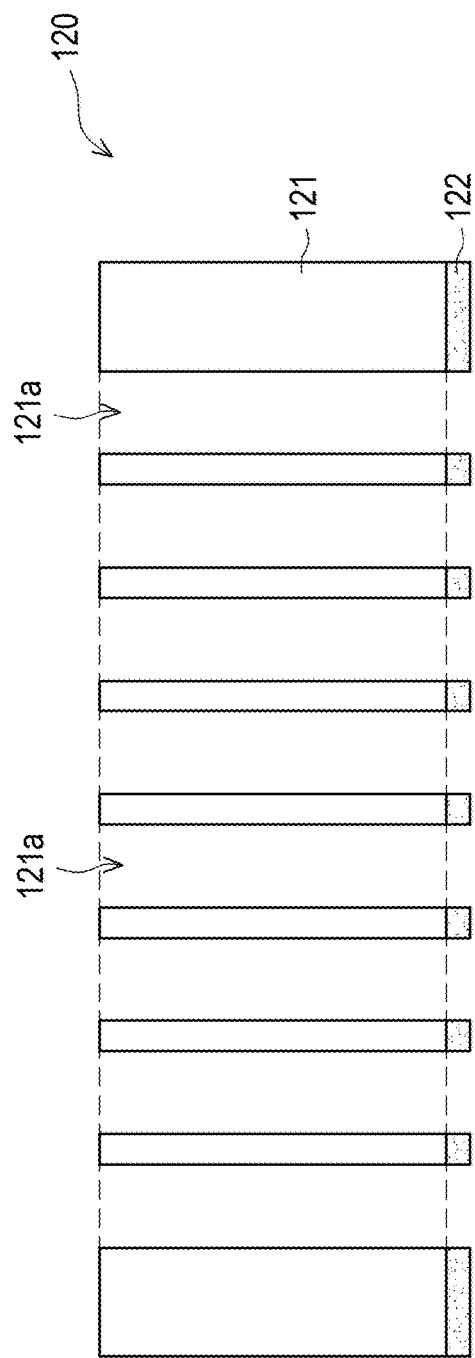

SEMICONDUCTOR SUBSTRATE AND MANUFACTURING METHOD THEREOF

CROSS-REFERENCE TO RELATED APPLICATION

This application claims the priority benefit of the U.S. provisional application Ser. No. 63/640,210, filed on Apr. 30, 2024. The entirety of the above-mentioned patent application is hereby incorporated by reference herein and made a part of this specification.

BACKGROUND

Technical Field

The disclosure relates to a semiconductor substrate and a manufacturing method thereof.

Description of Related Art

Currently, through Glass Vias (TGVs) are produced by following steps. First, a seed layer (such as Ti/Cu layer) may be formed in through holes of a glass layer, and then plating is performed in the through holes, however, in these process design, TGVs generally have defects and cannot be selected, thereby adversely affecting the reliability and yield of the semiconductor substrate.

SUMMARY

The disclosure provides a semiconductor substrate and a manufacturing method thereof, which has better reliability and yield.

A semiconductor substrate includes a first structure and a second structure. The first structure includes a circuit layer and a vertical conductive connector. The second structure includes a glass layer and an adhesive layer. The vertical conductive connector is landing on the circuit layer. The glass layer includes a through hole. The vertical conductive connector of the first structure is assembled in the through hole of the second structure and electrically connected to the circuit layer. The adhesive layer is bonded between the glass layer and the circuit layer.

A manufacturing method of a semiconductor substrate includes: forming a first structure including a circuit layer and a vertical conductive connector on a carrier; forming a second structure including a glass layer and an adhesive layer; assembling the first structure and the second structure by the adhesive layer, such that the vertical conductive connector penetrating through the glass layer.

Based on the above, due to the first structure and the second structure are inspected and be made separately in advance, thereby the quality of the vertical conductive connectors and the glass layer may be definitely controlled and improved. By doing so, the semiconductor substrate may have better reliability and yield.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 to FIG. 9 are partial schematic cross-sectional views illustrating a manufacturing method of a semiconductor substrate according to some embodiments of the disclosure.

DESCRIPTION OF THE EMBODIMENTS

Figure 1:
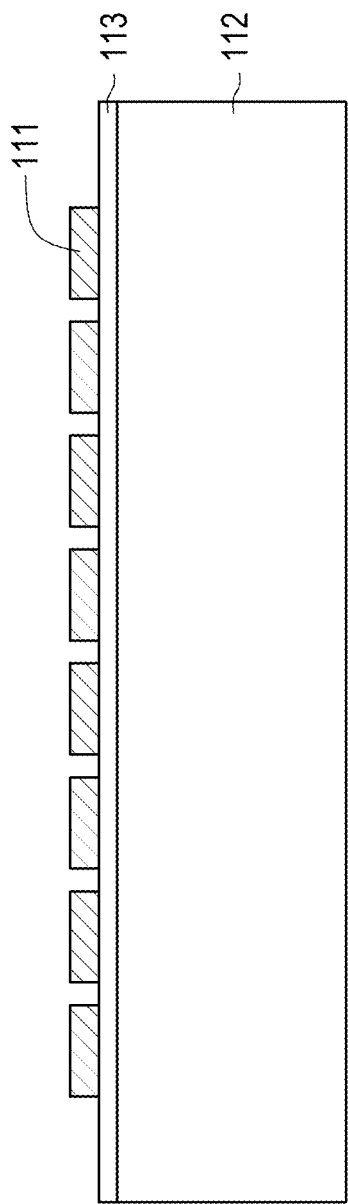

Exemplary embodiments of the disclosure are described below comprehensively with reference to the figures, but the disclosure may also be implemented in different ways and should not be construed as limited to the embodiments described herein. In the drawings, for the sake of clarity, the size and thickness of various regions, parts, and layers may not be drawn to actual scale. In order to facilitate understanding, the same elements in the following description are described with the same symbols.

The disclosure is more comprehensively described with reference to the figures of this embodiment. However, the disclosure may also be implemented in various different forms, and is not limited to the embodiments in the present specification. Thicknesses, dimensions, and sizes of layers or regions in the drawings are exaggerated for clarity. The same reference numbers are used in the drawings and the description to indicate the same or like parts, which are not repeated in the following embodiments.

Directional terms (for example, upper, lower, right, left, front, back, top, and bottom) used herein only refer to the graphical use, and are not intended to imply absolute orientation.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion.

Unless otherwise defined, all terms (including technical and scientific terms) used herein have the same meaning as that commonly understood by one of ordinary skill in the art to which this disclosure belongs.

FIG. 1 to FIG. 9 are partial schematic cross-sectional views illustrating a manufacturing method of a semiconductor substrate according to some embodiments of the disclosure. FIG. 10 is a partial schematic top view corresponding to FIG. 9.

Referring to FIG. 1, a plurality of pads 111 are formed on a carrier 112. For example, the pads 111 may have conductive pattern for matching the subsequent components formed thereon (such as the vertical conductive connectors 116 in FIG. 4). In some embodiments, the carrier 112 may be made of glass or other suitable materials, as long as the materials may withstand the subsequent process and simultaneously support the overlying structure. In some embodiments, the pads 111 may be formed of copper, gold, nickel, aluminum, platinum, tin, combinations thereof, alloys thereof, or other suitable conductive materials by suitable depositing process on the carrier 112, but the disclosure is not limited thereto.

In embodiment of FIG. 1, a releasing layer 113 (such as a light-to-heat conversion film or other suitable releasing layer) may optionally be coated between the carrier 112 and the pads 111 for enhancing the peeling ability between the carrier 112 and the pads 111 in the subsequent process, but the disclosure is not limited thereto. In some embodiments, the releasing layer is omitted.

Figure 2:
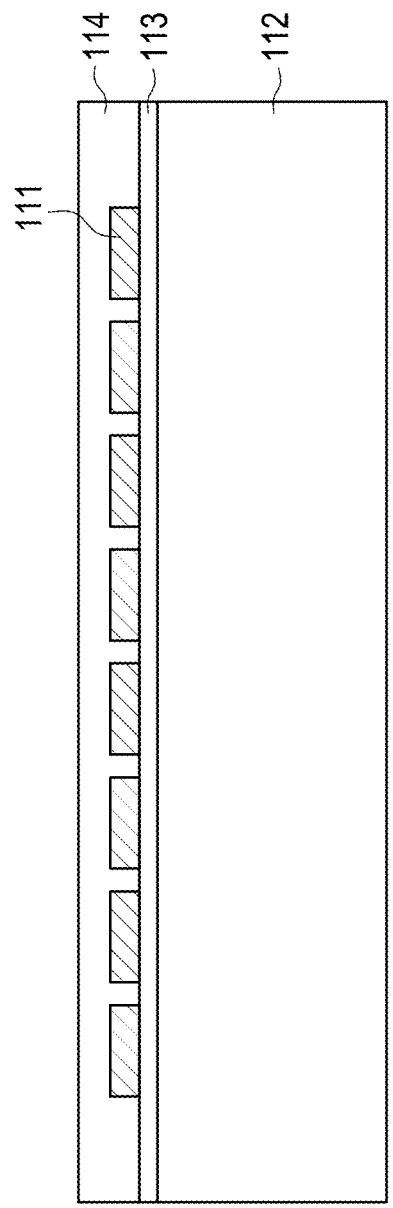
Figure 3:
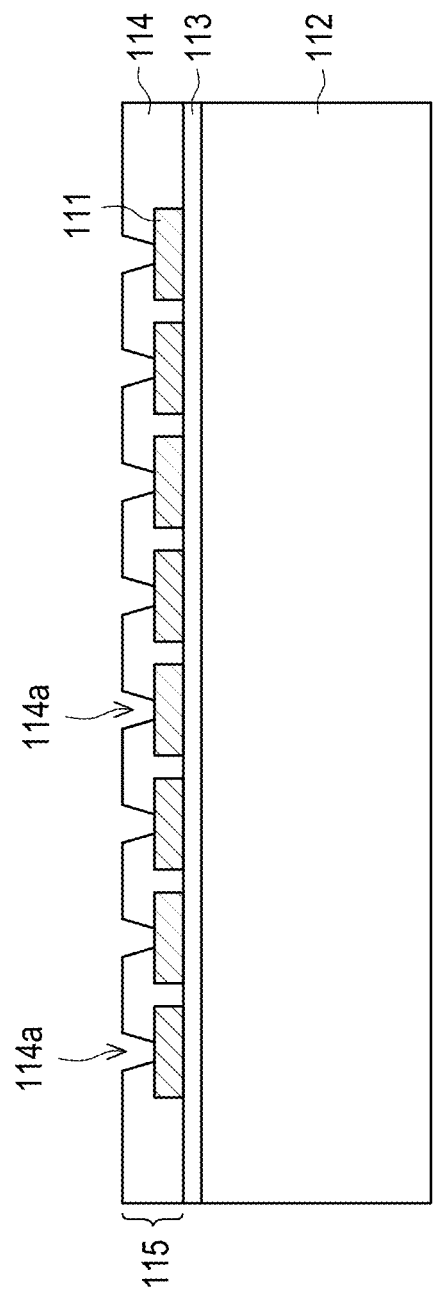

Referring to FIG. 2 to FIG. 3, a dielectric layer 114 is formed on the carrier 112 to electrically isolate the pads 111. Next, the dielectric layer 114 is patterned to form a plurality of openings 114a to expose surfaces of the pads 111 for subsequent electrical connection. Herein, the pads 111 and the dielectric layer 114 may be served as a circuit layer 115. It should be noted that the circuit layer 115 shown in FIG. 3 is merely an exemplary illustration, and more layers or different circuit designs may be formed according to design requirements.

In some embodiments, the dielectric layer 114 may be made of suitable photosensitive material and the openings 114a are formed by the photolithography process (such as performing the exposure process, developing process, and/or curing process), but the disclosure is not limited thereto.

Figure 4:
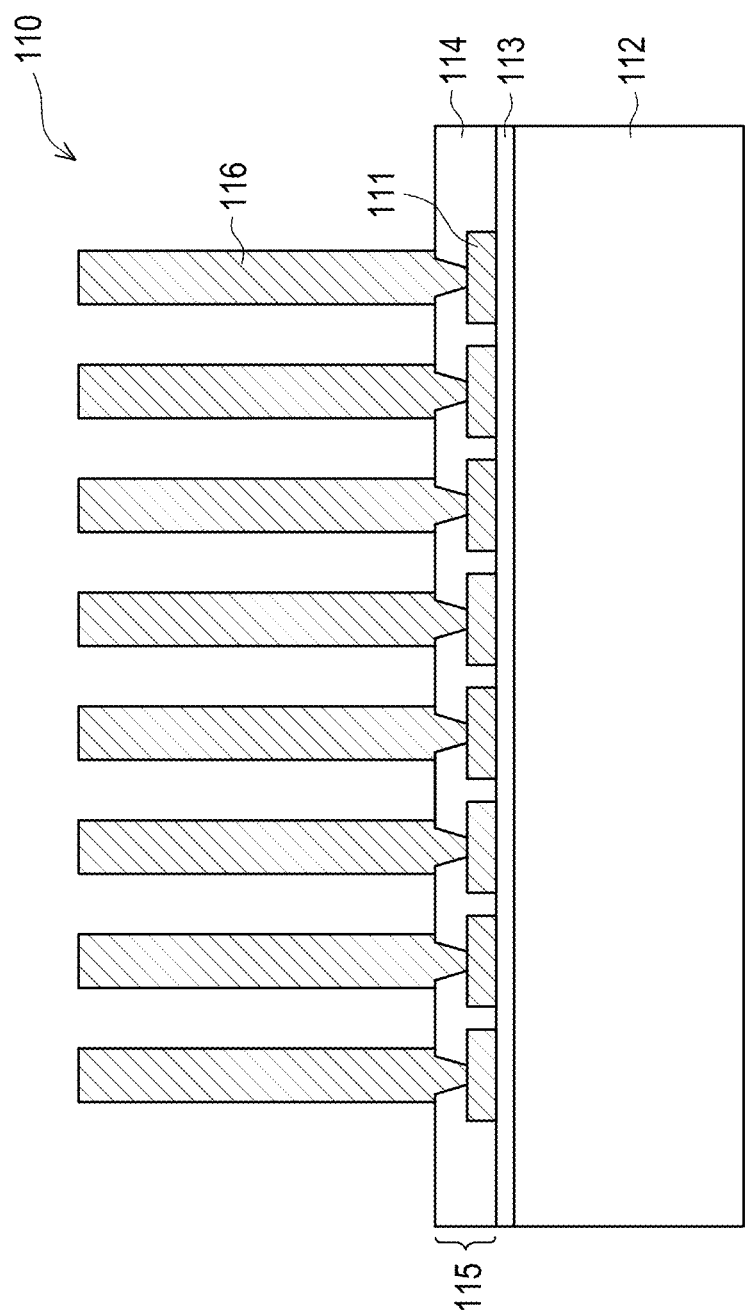

Referring to FIG. 4, a plurality of vertical conductive connectors 116 are formed on the circuit layer 115. For example, a plating process (e.g., electroplating) with photomasks (not shown) is performed in the openings 114a and grown in situ to form the vertical conductive connectors 116, namely, the vertical conductive connectors 116 are landing on the circuit layer 115 and formed from inside to outside of the openings 114a, thereby part of the vertical conductive connectors 116 are embedded in the dielectric layer 114 and electrically connected to the pads 111 of the circuit layer 115.

In some embodiments, an end portion near the circuit layer 115 of the vertical conductive connector 116 is tapered toward a direction of the carrier 112 (e.g., tapered in width or diameter), but the disclosure is not limited thereto. In some embodiments, the vertical conductive connectors 116 may be copper pillars or the like, but the disclosure is not limited thereto. Herein, the manufacturing of a first structure 110 including the circuit layer 115 and the vertical conductive connectors 116 of the present embodiment may be generally completed through the manufacturing process from FIG. 1 to FIG. 4.

In the disclosure, the first structure 110 may be made separately in advance. Further, in the first structure 110, the vertical conductive connectors 116 may be exposed, for example, the vertical conductive connectors 116 are not surrounded by glass or other substrate materials, in this way, defects of the vertical conductive connectors 116 may be inspected clearly and easily, such that unqualified vertical conductive connectors 116 may be removed, known good vertical conductive connectors 116 (like known good copper pillars) having better electrical performance may be remained, that is to say, the vertical conductive connectors 116 may be preselected. In some embodiments, the defects may include bubbles or impurities trapped in the vertical conductive connectors 116 causing adverse influence (such as worse electrical performance) to the vertical conductive connectors 116.

Referring to FIG. 5, a plurality of through holes 121a are formed in the glass layer 121. In some embodiments, the through holes 121a may be formed by laser drill, photolithography, or other suitable process. Herein, the number of through holes 121a are corresponding to the number of vertical conductive connectors 116, such that the through holes 121 and the vertical conductive connectors 116 may be assembled by one-to-one bonding manner, but the disclosure is not limited thereto.

Referring to FIG. 6, an adhesive layer 122 is formed on the glass layer 121. For example, after forming an adhesive material, the through holes 121 are further penetrated through the adhesive material to form the adhesive layer 122, in this way, inner sidewalls of the glass layer 121 and inner sidewalls of the adhesive layer 122 are aligned. In some embodiments, the adhesive layer 122 may be formed by suitable materials and deposition methods, the disclosure is not limited thereto. Herein, the manufacturing of a second structure 120 including the glass layer 121 and the adhesive layer 122 of the present embodiment may be generally completed through the manufacturing process from FIG. 5 to FIG. 6.

In the disclosure, the second structure 120 may be made separately in advance. In the second structure 120, the through glass vias (TGVs) are not existed, by doing so, defects of the glass layer 121 may be inspected clearly and easily, such that unqualified glass layer 121 may be removed, known good glass layer 121 can be remained, that is to say, the glass layer 121 may be preselected. In some embodiments, the defects may include crack or the like propagated in the glass layer 121.

Figure 7:
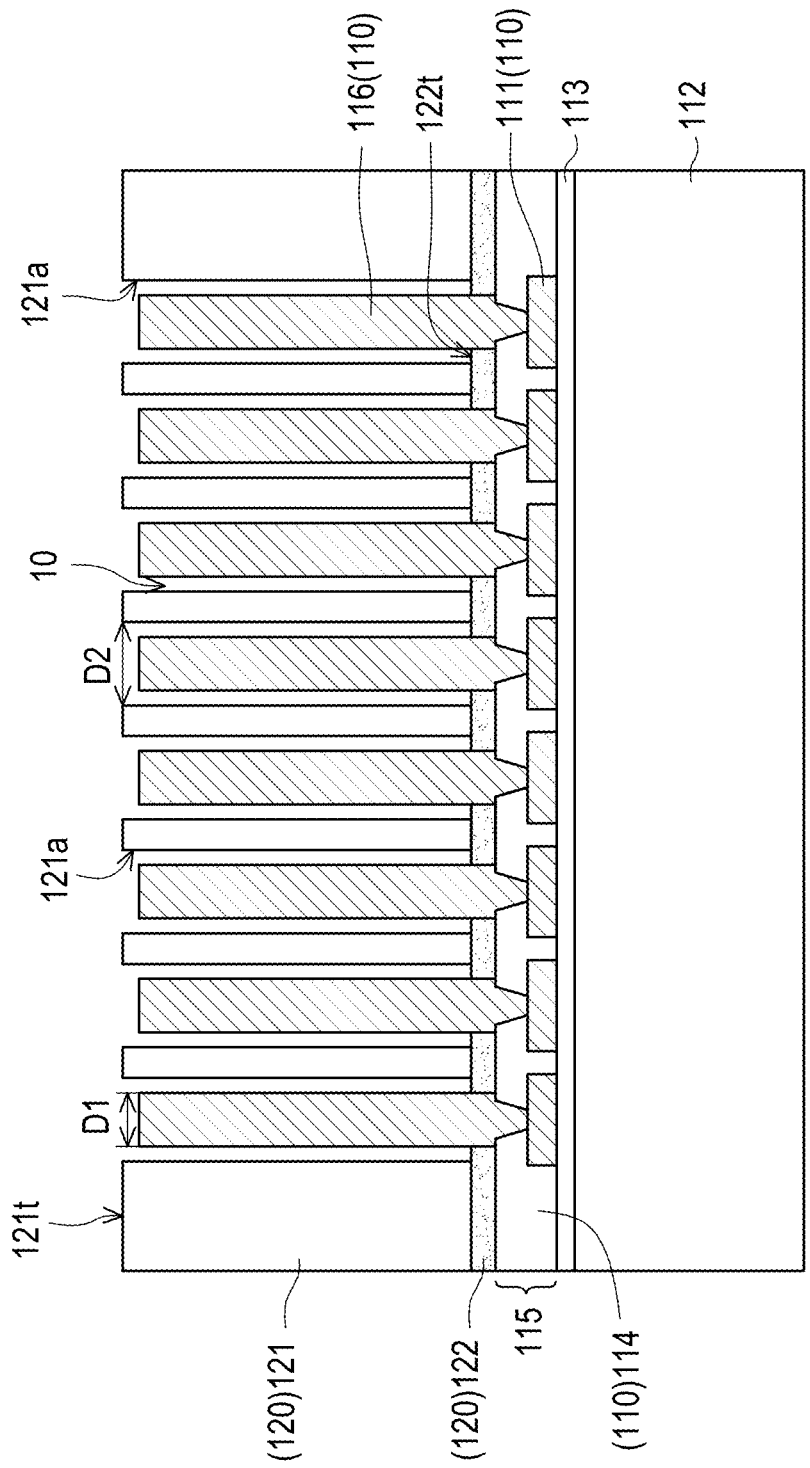

Referring to FIG. 7, assembling the first structure 110 and the second structure 120 by the adhesive layer 122, such that the vertical conductive connectors 116 penetrating through the glass layer 121. Due to the first structure 110 and the second structure 120 are inspected and be made separately in advance, thereby the quality of the vertical conductive connectors 116 (such as known good pillars) and the glass layer 121 (such as known good glass) may be definitely controlled and improved. By doing so, the semiconductor substrate may have better reliability and yield.

In FIG. 7, a size D1 (e.g. diameter) of each of the vertical conductive connectors 116 is smaller than a size D2 (e.g. diameter) of each of the through holes 121a, such that a gap 10 is located between the adjacent vertical conductive connector 116 and the glass layer 121. Moreover, in these embodiments, the adhesive layer 122 is compressed and flows to directly contact the vertical conductive connectors 116 during the assembling process, thereby the through holes 121a (such as the gap 10) expose a top surface 122t of the adhesive layer 122, but the disclosure is not limited thereto.

Following the assembling process, part of the adhesive layer 122 is extended laterally below the through holes 121a until covers sidewalls of the vertical conductive connectors 116, namely, part of the adhesive layer 122 is underlying the through holes 121a and beside the vertical conductive connectors 116, but the disclosure is not limited thereto.

In some embodiments, the vertical conductive connectors 116 are recessed in the through holes 121a, for example, the vertical conductive connectors 116 are located below a top surface 121t of the glass layer 121, but the disclosure is not limited thereto.

In some embodiments, before assembling, the first structure 110, the second structure 120, or combination thereof may be cut into pieces for accurate bonding, but the disclosure is not limited thereto.

Figure 8:
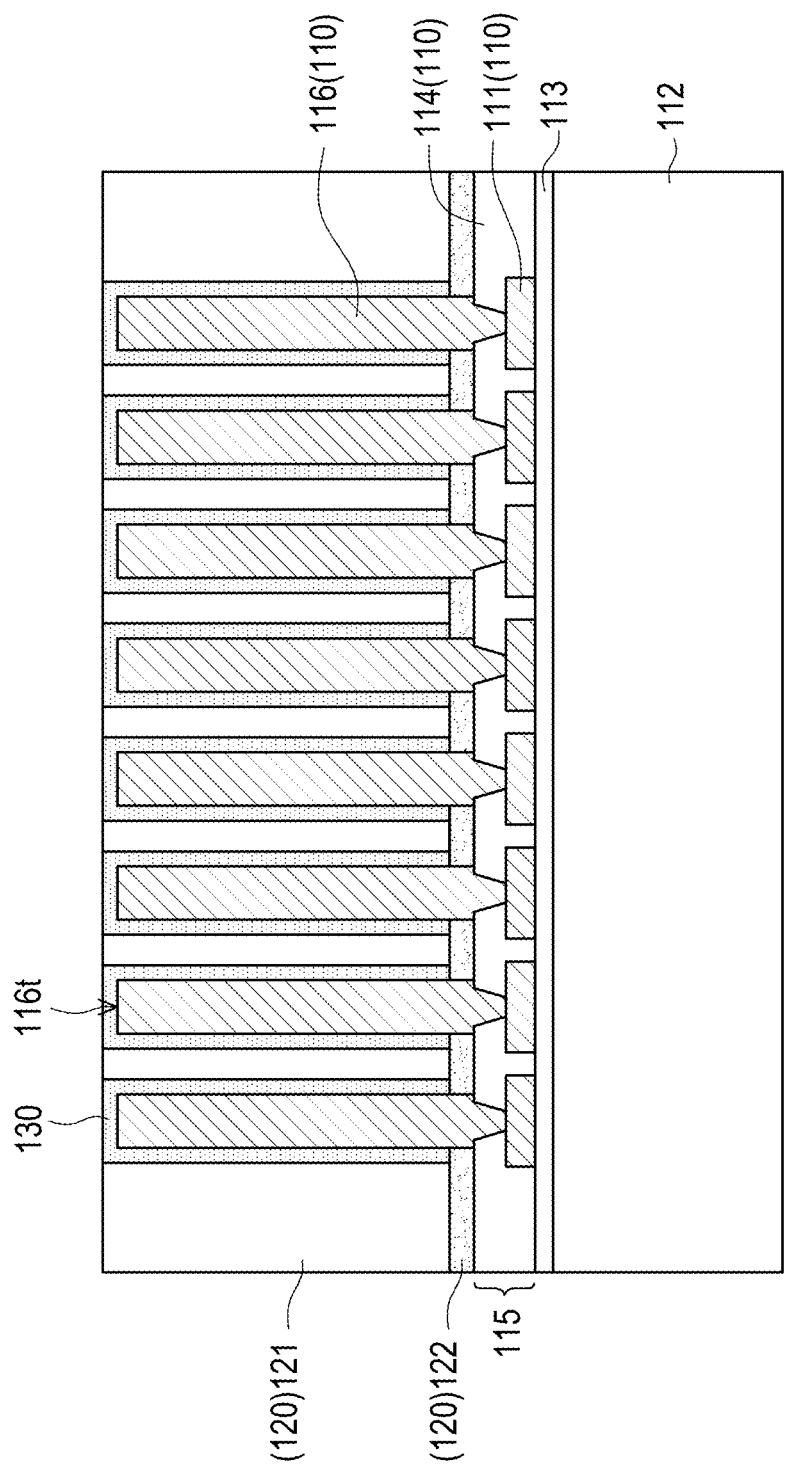

Referring to FIG. 8, a buffer layer 130 is formed on the vertical conductive connectors 116 conformally, therefore, the buffer layer 130 is filled in the gap 10 located over top surfaces 116t of the vertical conductive connectors 116. Also, the through holes 121a are filled up with the vertical conductive connectors 116 and the buffer layer 130, thereby one through hole 121a includes one vertical conductive connector 116 and part of the buffer layer 130, namely, the through hole 121a may be composed of the vertical conductive connector 116 and the buffer layer 130. Herein, materials of the buffer layer 130 include hole plugging material, such as THP-100 or the like.

Based on material properties, a coefficient of thermal expansion (CTE) of the glass layer 121 is different from a coefficient of thermal expansion of the vertical conductive connector 116, such that stress may be existed between the glass layer 121 and the vertical conductive connector 116, for compensating the stress, the buffer layer 130 is formed to absorb stress, and the coefficient of thermal expansion mismatch may be improved, and the semiconductor substrate may have better reliability and yield.

In some embodiments, sidewalls of the vertical conductive connectors 116 are covered by the buffer layer 130, the adhesive layer 122, and the dielectric layer 114 of the circuit layer 115, for example, sidewalls of the vertical conductive connectors 116 in direct contact with the buffer layer 130, the adhesive layer 122, and the dielectric layer 114 of the circuit layer 115, but the disclosure is not limited thereto.

In some embodiments, the buffer layer 130 may use suitable liquid filling materials or low viscosity film type materials by suitable depositing process, but the disclosure is not limited thereto.

Figure 9:
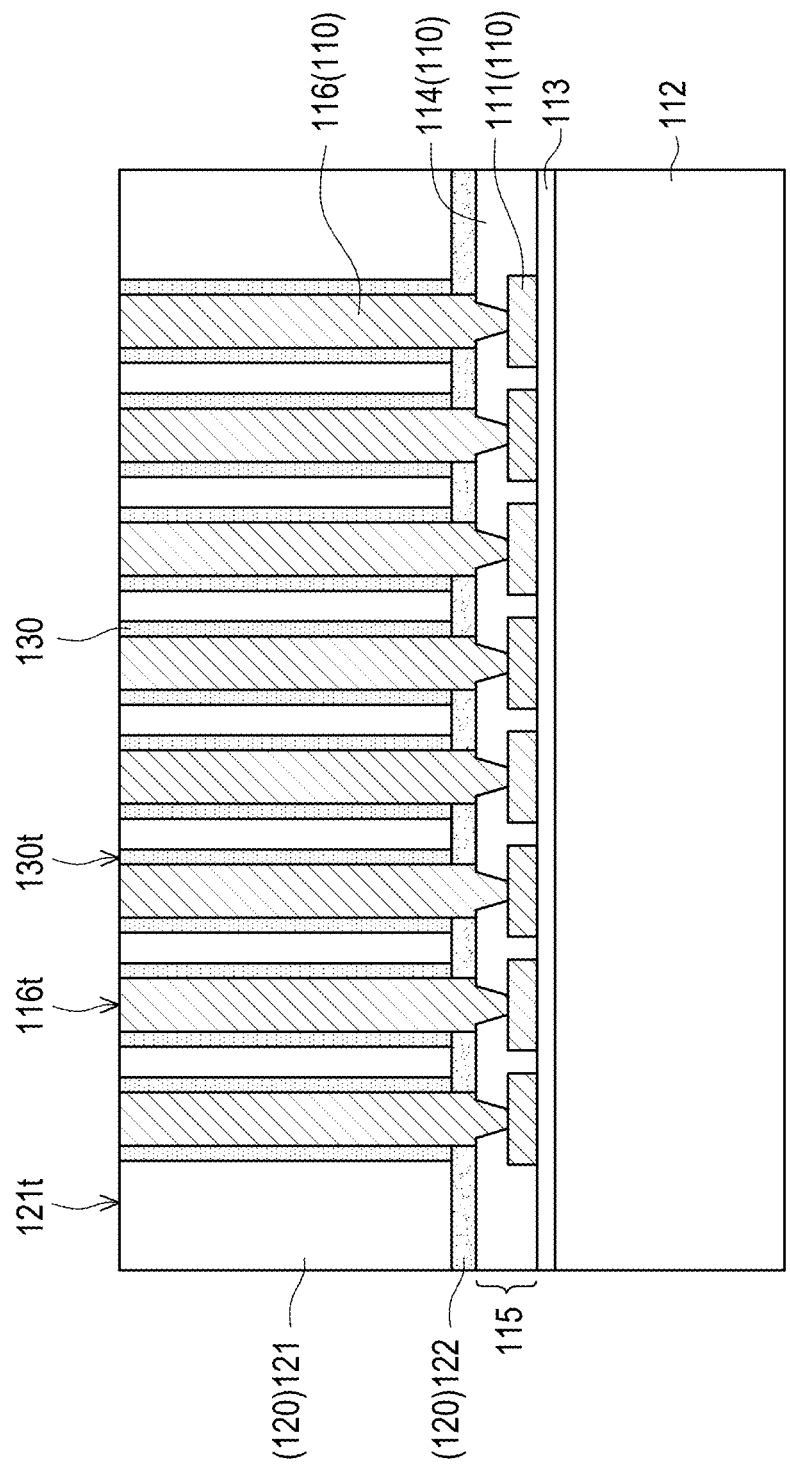
Figure 10:
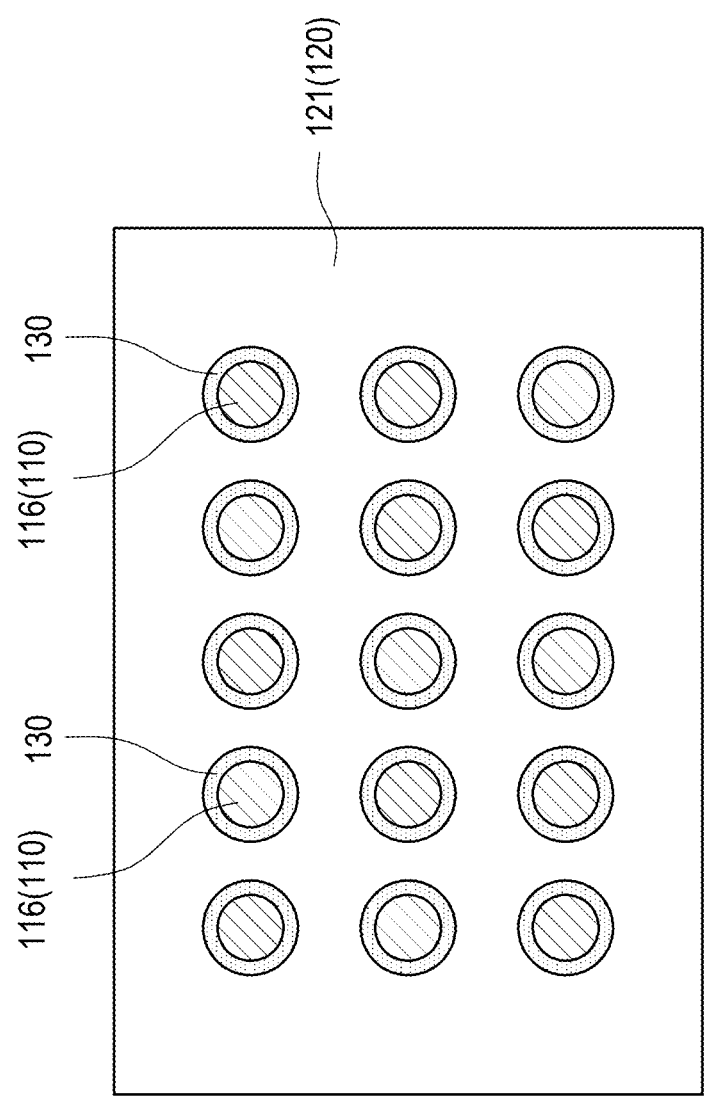
FIG. 10 is a partial schematic top view corresponding to FIG. 9.

Referring to FIG. 9 and FIG. 10, for further connecting with other components, a planarization process (e.g., a grinding process, a chemical mechanical polishing process, or a combination thereof) is performed to remove excess materials, such that the top surfaces 116t of the vertical conductive connectors 116, a top surface 130t of the buffer layer 130, and a top surface 121t of the glass layer 121 are coplanar. Also, the top surfaces 116t of the vertical conductive connectors 116 are exposed. On the other hand, as shown in FIG. 10, the vertical conductive connectors 116 are enclosed by the buffer layer 130, such that the vertical conductive connector 116 and the buffer layer 130 adjacent thereof are coaxial annular shape. The manufacturing of a semiconductor substrate of the present embodiment may be generally completed through the manufacturing process from FIG. 1 to FIG. 9.

In present embodiment, semiconductor substrate includes the first structure 110 and the second structure 120, The first structure 110 includes the circuit layer 115 and the vertical conductive connector 116 landing on the circuit layer 115. The second structure 120 includes the glass layer 121 including the through hole 121a, and the adhesive layer 122 bonded between the glass layer 121 and the circuit layer 115, wherein the vertical conductive connector 116 of the first structure 110 is assembled in the through hole 121a of the second structure 120 and electrically connected to the circuit layer 115. Due to the first structure 110 and the second structure 120 are inspected and be made separately in advance, thereby the quality of the vertical conductive connectors 116 (such as known good pillars) and the glass layer 121 (such as known good glass) may be definitely controlled and improved. By doing so, the semiconductor substrate may have better reliability and yield.

It should be noted herein that the reference numerals of components and some contents in the foregoing embodiments also apply in the following embodiments, wherein the same reference numerals are used to denote the same or similar components, and the descriptions of the same technical contents are omitted. For the description of the omitted part, reference can be made to the foregoing embodiments, and the details are not described in the following embodiments again.

Figure 11:
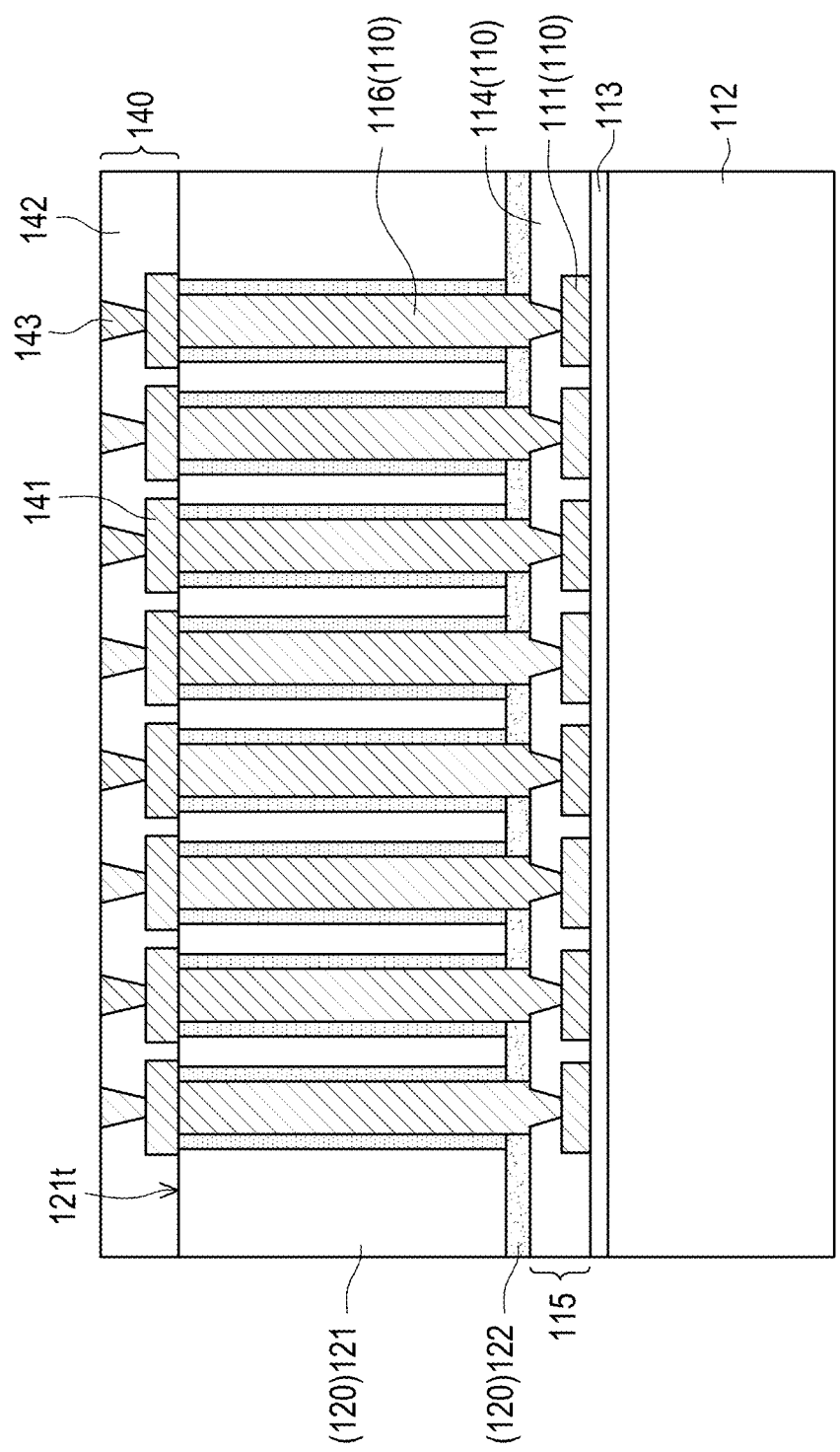
FIG. 11 is a partial schematic cross-sectional view illustrating a semiconductor substrate according to some embodiments of the disclosure.

FIG. 11 is a partial schematic cross-sectional view illustrating a semiconductor substrate according to some embodiments of the disclosure. Referring to FIG. 11, in this embodiment, following by FIG. 9, a circuit layer 140 is formed on the structure in FIG. 9. For example, first, a plurality of pads 141 may be directly formed on the vertical conductive connectors 116 and electrically connected to the circuit layer 115 through the vertical conductive connector 116, wherein the pads 141 cover the through holes 121a and parts of a top surface 121t of the glass layer 121 and are directly in contact with the vertical conductive connectors 116, thereby the pads 141 may reduce bias between the adjacent vertical conductive connectors 116, and the electrical performance may be improved.

After forming the pads 141, a dielectric layer 142 is formed on the pads 141 to electrically isolate the pads 141. Next, the dielectric layer 142 is patterned to form a plurality of openings (not shown) to expose surfaces of the pads 142 for subsequent electrical connection. At last, a plurality of vias 143 may be formed in the openings of the dielectric layer 142. In some embodiments, the via 143 is tapered toward a direction of the carrier 112 (e.g., tapered in width or diameter), but the disclosure is not limited thereto.

In some embodiments, the pads 141 and the vias 143 may be formed of copper, gold, nickel, aluminum, platinum, tin, combinations thereof, alloys thereof, or other suitable conductive materials by suitable depositing process, but the disclosure is not limited thereto. In some embodiments, the dielectric layer 142 may be made of photosensitive material and the openings are formed by the photolithography process (such as performing the exposure process, developing process, and/or curing process), but the disclosure is not limited thereto.

Figure 12:
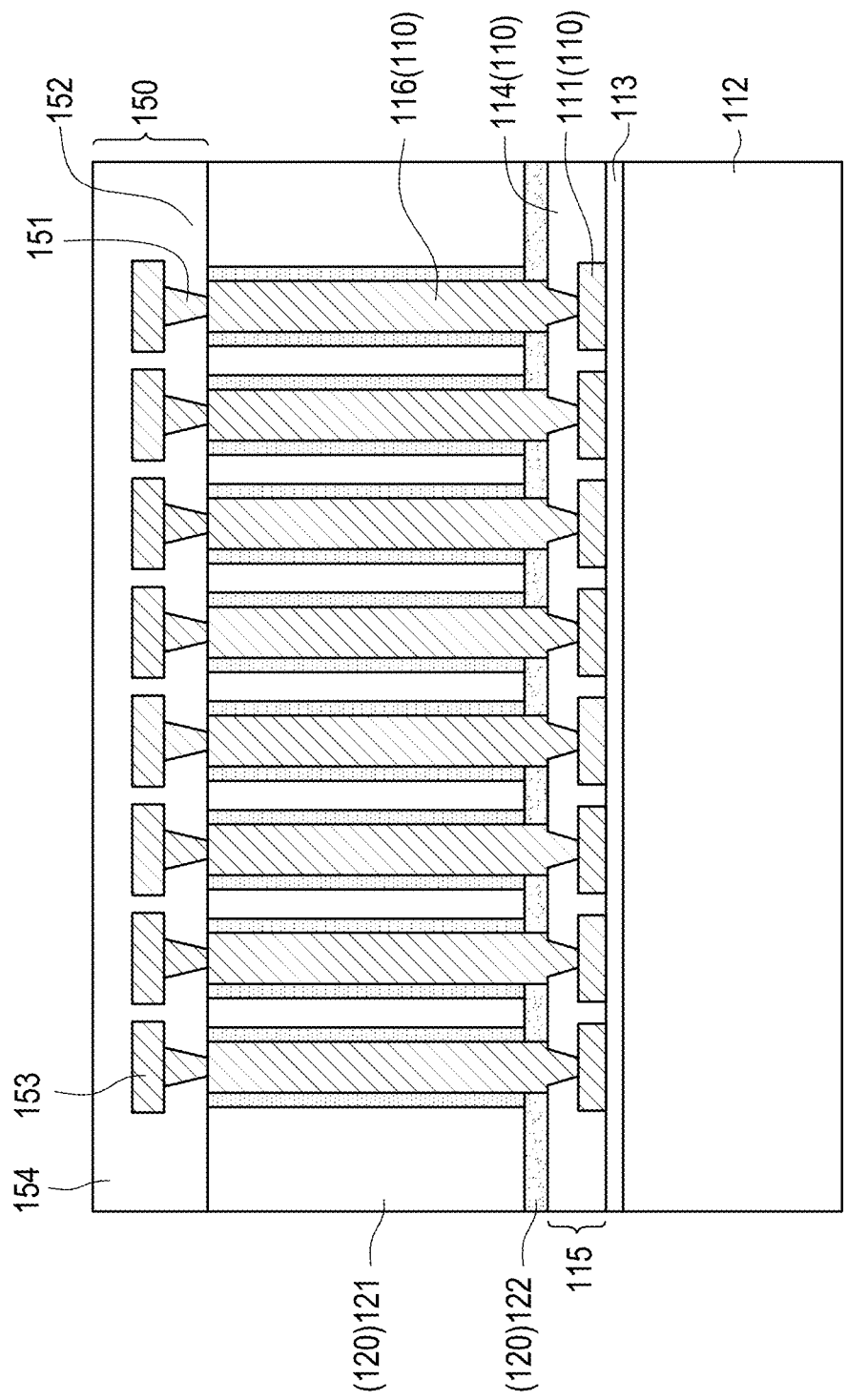
FIG. 12 is a partial schematic cross-sectional view illustrating a semiconductor substrate according to some embodiments of the disclosure.

FIG. 12 is a partial schematic cross-sectional view illustrating a semiconductor substrate according to some embodiments of the disclosure. Referring to FIG. 12, in this embodiment, following by FIG. 9, a circuit layer 150 is formed on the structure in FIG. 9. For example, first, a plurality of vias 151 may be directly formed on the vertical conductive connectors 116 and electrically connected to the circuit layer 115 through the vertical conductive connector 116, wherein the vias 151 are separated from the glass layer 121 with a distance greater than zero and directly in contact with the vertical conductive connectors 116, thereby the vias 151 may be not affected the glass layer 121, meanwhile the pads directly in contact with the vertical conductive connector 116 may be omitted, in this way, the manufacturing cost may be reduced and the electrical performance may be improved. In some embodiments, the via 151 is tapered toward a direction of the carrier 112 (e.g., tapered in width or diameter), but the disclosure is not limited thereto.

After forming the vias 151, a dielectric layer 152 is formed on the vias 151 to electrically isolate the vias 151. Next, the dielectric layer 152 is patterned to form a plurality of openings (not shown) to expose surfaces of the vias 151 for subsequent electrical connection. A plurality of pads 153 may be formed in the openings of the dielectric layer 152. At last, a dielectric layer 154 is formed on the pads 153.

In some embodiments, the pads 153 and the vias 151 may be formed of copper, gold, nickel, aluminum, platinum, tin, combinations thereof, alloys thereof, or other suitable conductive materials by suitable depositing process, but the disclosure is not limited thereto. In some embodiments, the dielectric layer 122, 154 may be made of photosensitive material and the openings are formed by the photolithography process (such as performing the exposure process, developing process, and/or curing process), but the disclosure is not limited thereto.

Figure 13:
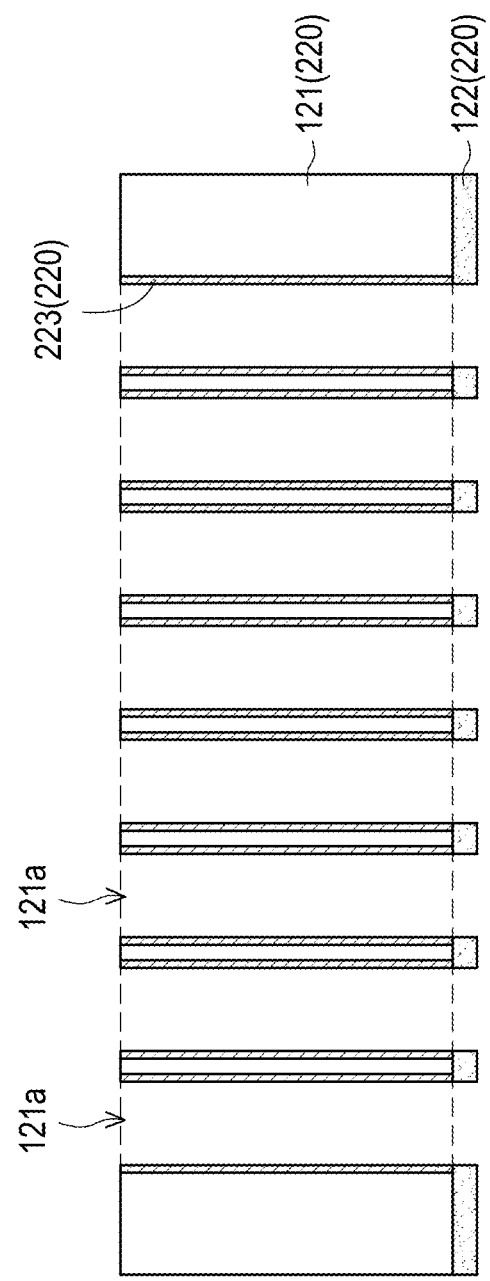
FIG. 13 and FIG. 14 illustrate cross-sectional views of intermediate steps during the manufacturing method of a semiconductor substrate according to some embodiments of the disclosure.
Figure 14:
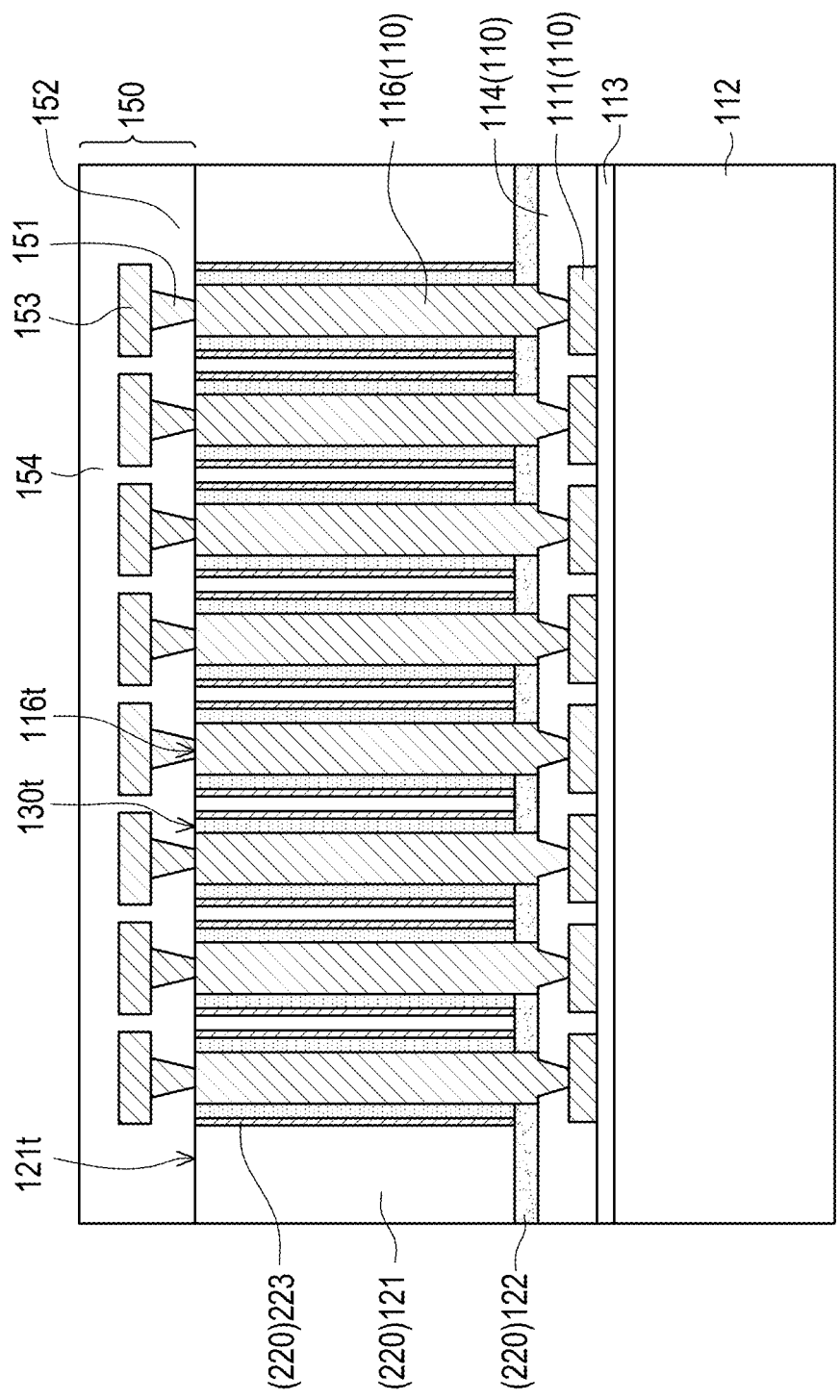

FIG. 13 and FIG. 14 illustrate cross-sectional views of intermediate steps during the manufacturing method of a semiconductor substrate according to some embodiments of the disclosure. Referring to FIG. 13 and FIG. 14, in this embodiment, the second structure 220 may further include an extra connector layer r 223 having an outer ring surface and located on the through hole 121a. To be specific, as shown in FIG. 13, before assembling to the first structure 110, the extra connector layer 223 is formed on sidewalls of the glass layer 121 (such as formed in the through holes 121a). Next, similar to FIG. 7 to FIG. 9, a structure in FIG. 14 may be formed as following. The first structure 110 and the second structure 220 may be assembling by the adhesive layer 122, the buffer layer 130 is formed on the vertical conductive connectors 116 conformally, and a planarization process is performed, such that the top surfaces 116t of the vertical conductive connectors 116, the top surface 130t of the buffer layer 130 and the top surface 121t of the glass layer 121 are coplanar. Moreover, Similar to FIG. 12, the circuit layer 150 is formed, wherein the vias 151 may be formed on the vertical conductive connectors 116 and electrically connected to the circuit layer 115 through the vertical conductive connector 116.

In some embodiments, the extra connector layer 223 may be metal layer located beside the vertical conductive connectors 116, wherein the extra connector layer 223 is a ground terminal, thereby the extra connector layer 223 may serve as EMI shielding component to reduce the interference to signals of the vertical conductive connectors 116, but the disclosure is not limited thereto. Alternatively, the extra connector layer 223 is a signal terminal, such that the vertical conductive connectors 116 and the extra connector layer 223 may be used to transfer different signals.

In other embodiments, a dielectric constant of the buffer layer 130 beside the extra connector layer is greater than 3.5 (high dielectric constant). In some embodiments, the outer ring surface of the extra connector layer 223 and the vertical conductive connectors 116 acts as a capacitor, for example, the dielectric constant of the buffer layer is very high, such as higher than 10 or even more.

Figure 15:
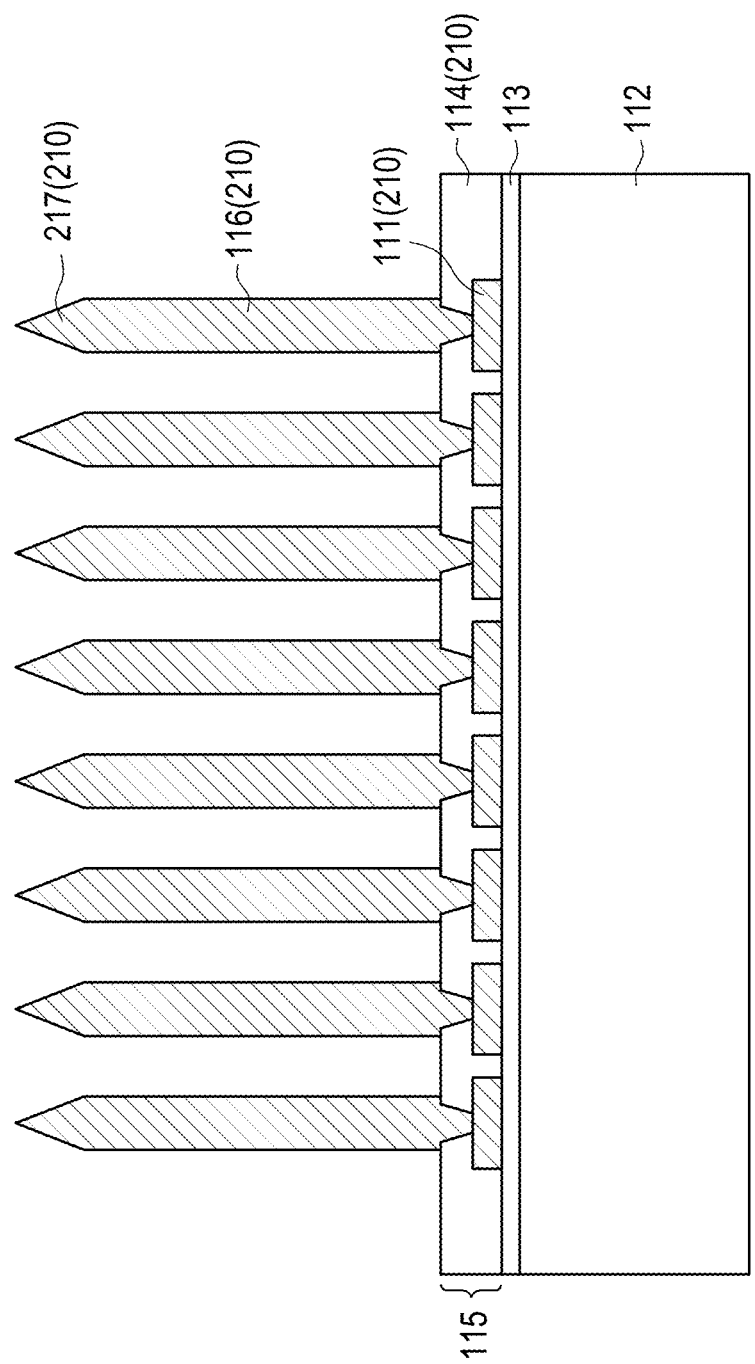
FIG. 15 and FIG. 16 illustrate cross-sectional views of intermediate steps during the manufacturing method of a semiconductor substrate according to some embodiments of the disclosure.
Figure 16:
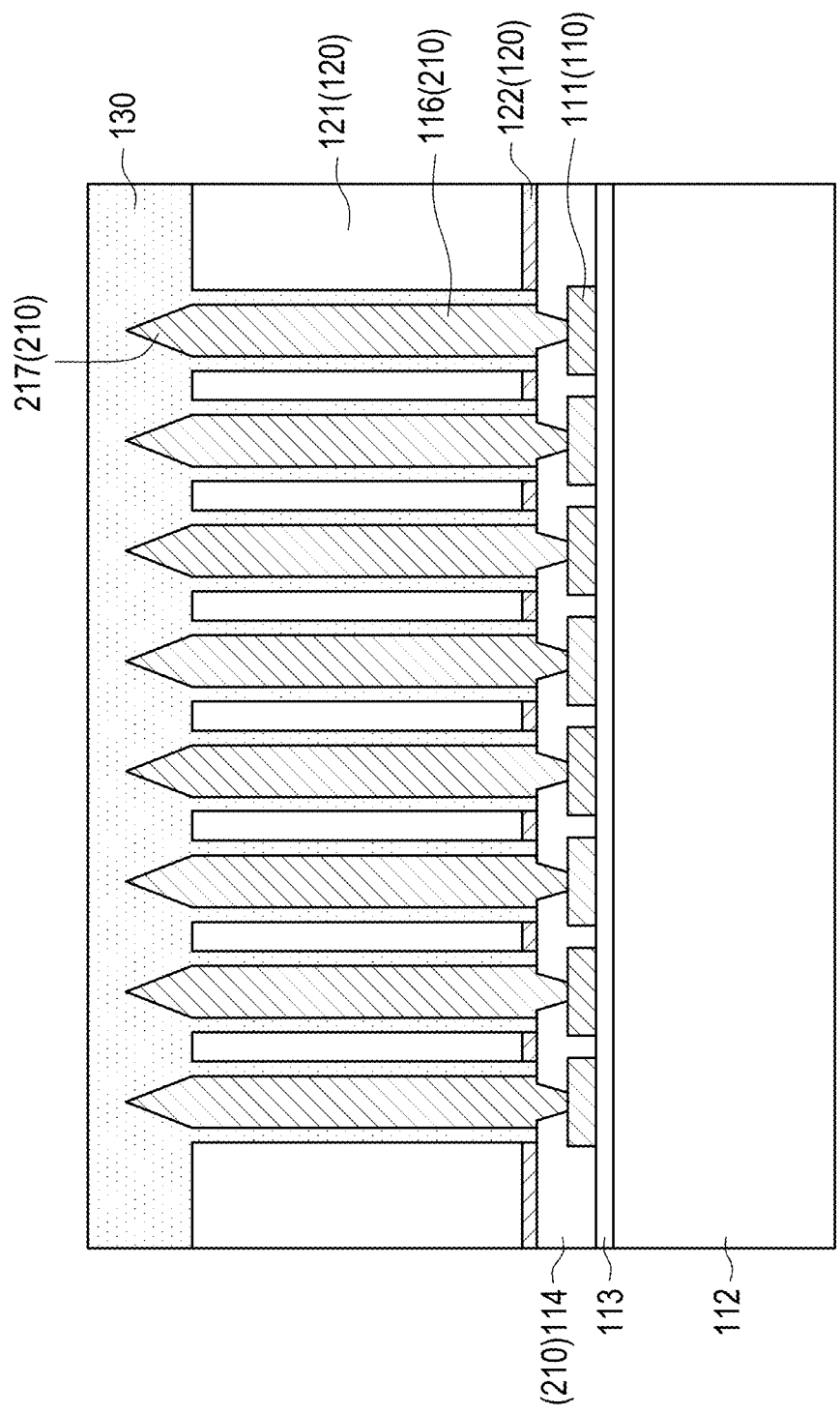

FIG. 15 and FIG. 16 illustrate cross-sectional views of intermediate steps during the manufacturing method of a semiconductor substrate according to some embodiments of the disclosure. Referring to FIG. 15 and FIG. 16, in this embodiment, the first structure 210 may further include a plurality of peak portions 217 located on a side of the vertical conductive connectors 116 away from the circuit layer 115. To be specific, as shown in FIG. 15, before assembling to the second structure 120 or 220, the peak portions 217 are formed on top surfaces of the vertical conductive connectors 116, by doing so, the assembly alignment accuracy may be improved. And then, Similar to FIG. 7 to FIG. 8, a structure in FIG. 16 may be formed as following. First, the first structure 210 and the second structure 120 may be assembling by the adhesive layer 122, the buffer layer 130 is formed on the vertical conductive connectors 116 conformally.

At last, similar to FIG. 9, the planarization process is performed, such that the top surface 116t of the vertical conductive connectors 116, a top surface 130t of the buffer layer 130 and a top surface 121t of the glass layer 121 are coplanar (not shown), in this way, after assembling the first structure and second structure, the peak portions 217 may be removed.

It should be noted that, according to actual application requirements, the carrier 112 may be optionally removed to expose the pads 111 and electrically connect with other elements (not shown). The releasing layer may be peeled off by applying external energy between a bottom surface of the pads 111 and the carrier 112.

FIGS. 17-20 are partial schematic cross-sectional views illustrating an electronic package including of a semiconductor substrate of some embodiments of the disclosure.

Figure 17:
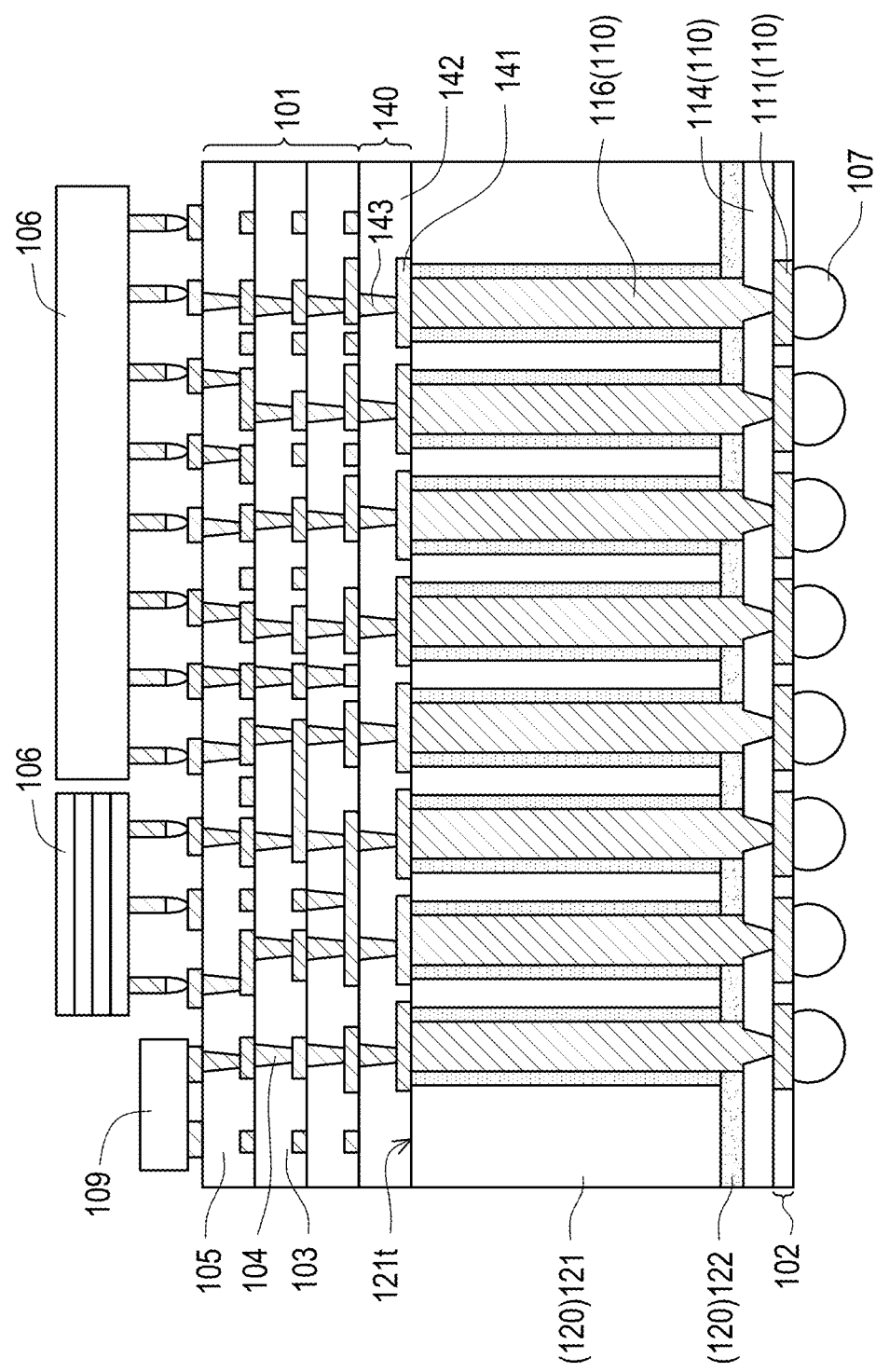
FIGS. 17-20 are partial schematic cross-sectional views illustrating an electronic package including of a semiconductor substrate of some embodiments of the disclosure.

Referring to FIG. 17, a glass core substrate of this embodiment further includes a circuit layer 101 and a circuit layer 102 disposed on opposite sides of the structure of FIG. 11. The circuit layer 101 is composed of a structure similar to the alternating stacking of the dielectric layer 103 and the conductive layer 104, and a solder mask 105 and the circuit layer 102 is one layer, however, circuit layer 102 is not limited to one layer, circuit layer 102 may be a plurality of layers same as structure of FIG. 20. The circuit layer 101 and the circuit layer 102 may be manufactured by suitable process (such as RDL process), but the disclosure is not limited thereto.

Further, as shown in FIG. 17, the electronic package may include a semiconductor substrate of aforementioned structure, a plurality of chips 106 (FIG. 17 schematically illustrates two chips 106, but it also may be more than two, such as three or four, etc.), and a plurality of external terminals 107, wherein the chips 106 and the external terminals 107 are disposed on the opposite surfaces of the semiconductor substrate respectively, the pitch of the circuit in the circuit structure close to the chips 106 may be smaller than the pitch of the circuit in the circuit structure close to the external terminals 107, that is, the circuit structures of the semiconductor substrate may include both a fine pitch and a coarse-pitch to fan out the signal of chips 106 to the external terminals 107, but the disclosure is not limited thereto.

In some embodiments, the chip 106 may be connected to a surface of the semiconductor substrate using, for example, flip chip bonding. The chip 106 may also be bonded to the surface of the semiconductor substrate using other suitable methods. In here, the chips 106 may be performed the same or different functions.

In some embodiments, the chip 106 is, for example, logic chip, memory chip, three-dimensional integrated circuit (3DIC) chip (such as high bandwidth memory chip), XPU, I/O, CPO and/or the like, wherein the 3DIC chip includes multiple layers stacked on each other, and through silicon vias (TSVs) are formed to provide vertical electrical connections between the layers, but the disclosure is not limited thereto. In here, the chip 106 may be a small chip form (chiplet).

In some embodiments, the external terminals 107 may be solder balls and may be formed using a ball placement process to be placed on the surface of the semiconductor substrate away from the chips 106, and a soldering process and a reflow process may be optionally performed to enhance the adhesion between the external terminals 107 and the circuits on the surface of the semiconductor substrate, but the disclosure is not limited thereto.

In some embodiments, a width (or diameter) of vias in the circuit layer 101 are gradually increases in a direction from the glass core substrate to the chips 106. Moreover, a width (or diameter) of vias in the circuit layer 102 are gradually increases in a direction from the glass core substrate to the external terminals 107, therefore, the tapered shape of vias of the circuit layer 101 and the circuit layer 102 are opposite.

In some embodiments, an electronic package of this embodiment further includes a passive component 109 located on the circuit layer 101. Herein, the passive component 109 may be any suitable types, the disclosure is not limited thereto.

Figure 18:
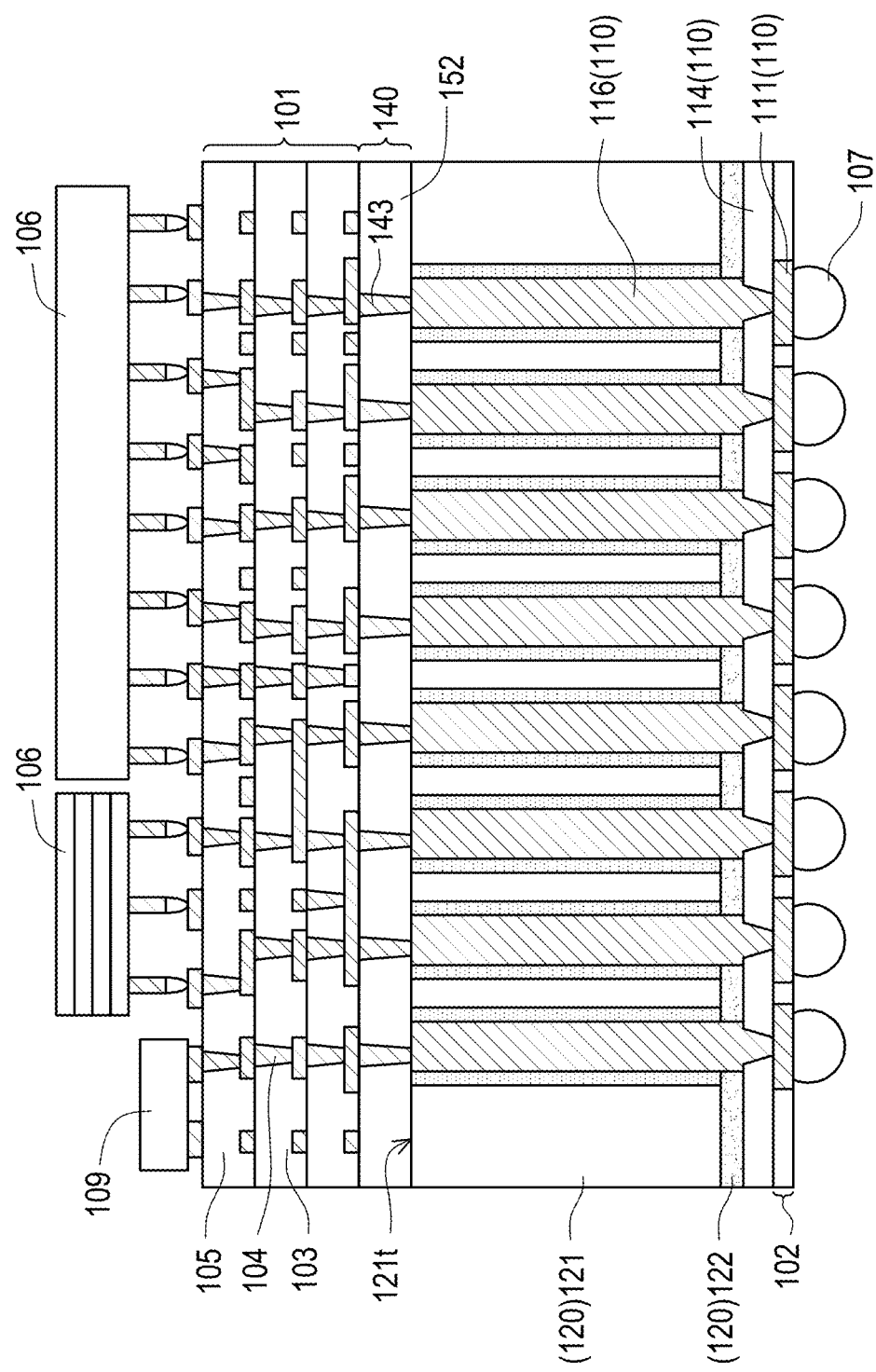
Figure 19:
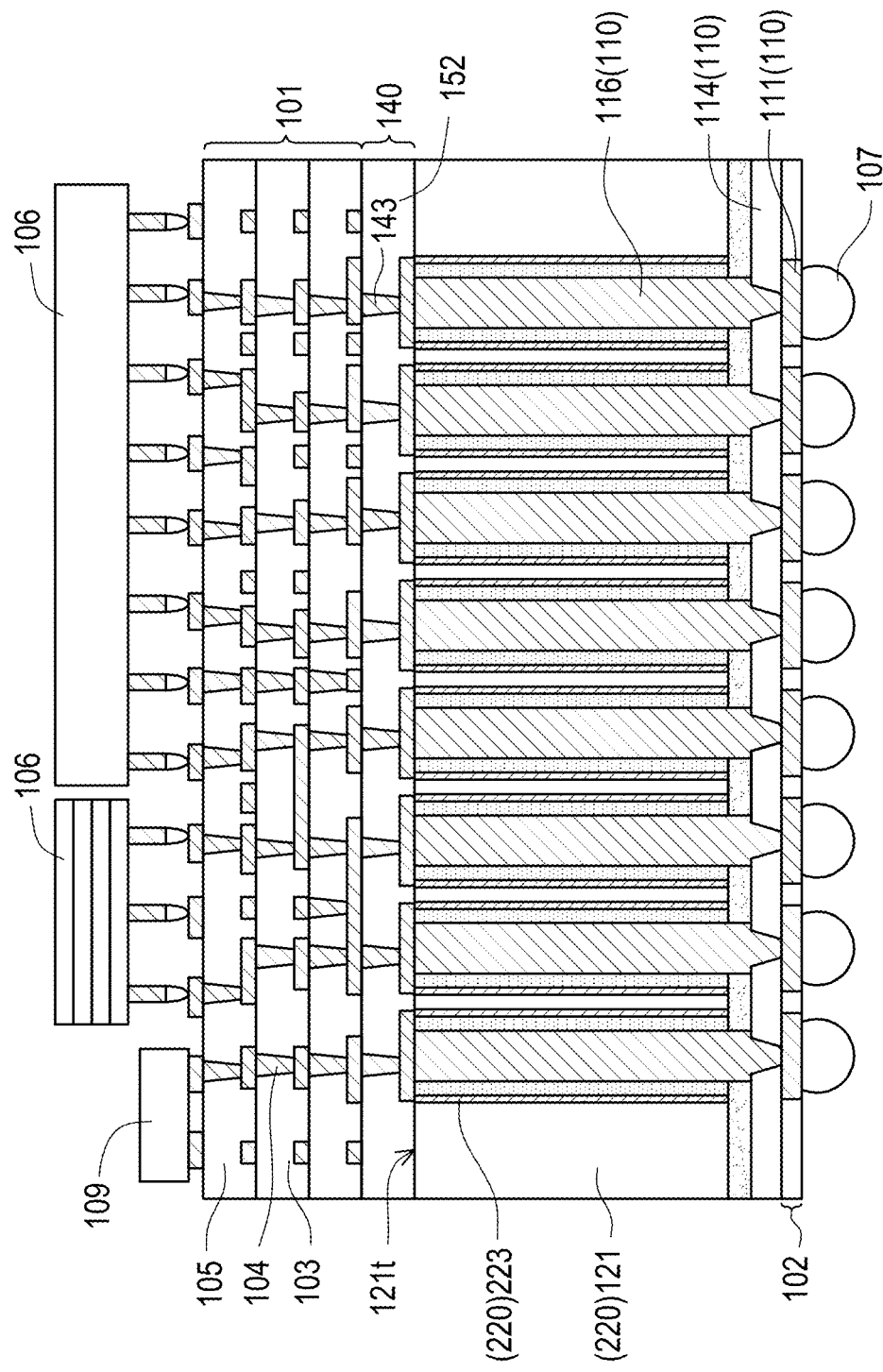

Referring to FIG. 18 and FIG. 19, compared with the electronic package of FIG. 17, a circuit layer 101 and a circuit layer 102 of an electronic package of FIG. 18 may be disposed on opposite sides of the structure of FIG. 12. In addition, a circuit layer 101 and a circuit layer 102 of an electronic package of FIG. 19 may be disposed on opposite sides of the structure of FIG. 14.

Figure 20:
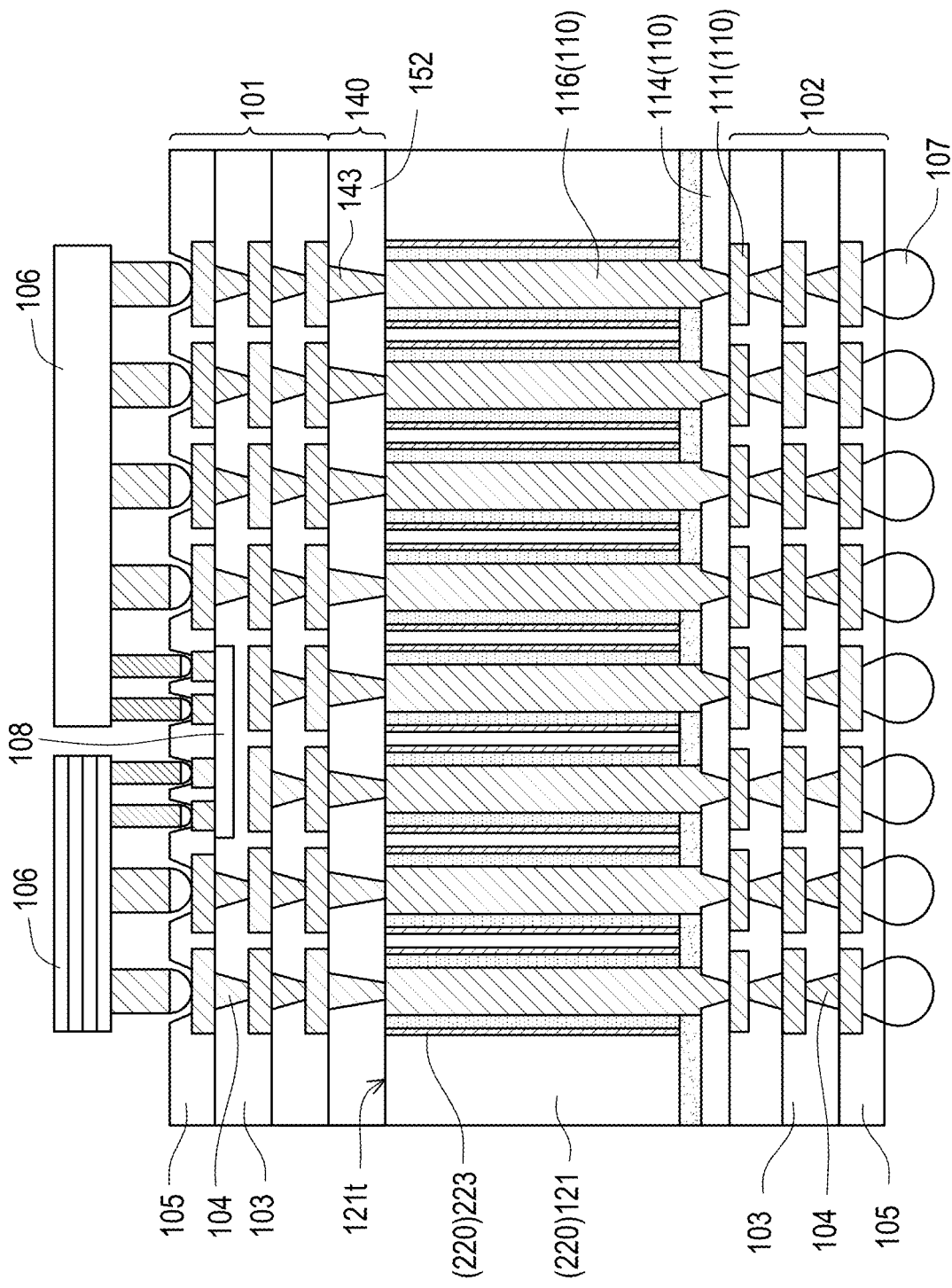

Referring to FIG. 20, compared with the electronic package of FIG. 19, an electronic package of this embodiment further includes a bridge die 108 embedded in the circuit layer 101 to provide interconnection between the chips 106. Herein, the bridge die 108 may be any suitable die types, the disclosure is not limited thereto.

In some embodiments, the circuit layer 101 and the circuit layer 102 can use the same dielectric material, for example, the circuit layer 101 and the circuit layer 102 can use different dielectric material, such as circuit layer 101 is photo sensitive polyimide, circuit layer 102 is ABF or vice vera.

In addition, the above-disclosed embodiments are only illustrative. Any combination and reasonable extension based on actual design requirements without departing from the spirit and scope of the disclosure should fall within the scope of protection of the disclosure.

To sum up, due to the first structure and the second structure are inspected and be made separately in advance, thereby the quality of the vertical conductive connectors and the glass layer may be definitely controlled and improved. By doing so, the semiconductor substrate may have better reliability and yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor substrate, comprising:
   a first structure, comprising:
     a circuit layer; and
     a vertical conductive connector landing on the circuit layer; and
   a second structure, comprising:
     a glass layer comprising a through hole bigger than the vertical conductive connector, wherein the vertical conductive connector of the first structure is assembled in the through hole of the second structure and electrically connected to the circuit layer, the vertical conductive connector extended in the through hole has straight vertical sidewalls, and the vertical conductive connector extended outside the through hole has taper-down shape sidewalls; and
     an adhesive layer bonded between the glass layer and the circuit layer.

2. The semiconductor substrate according to claim 1, wherein the through hole exposes a top surface of the adhesive layer.

3. The semiconductor substrate according to claim 1, further comprising a third structure having another one circuit layer and a surface treatment layer, wherein the second structure is disposed between the first structure and the third structure, and the surface treatment layer is disposed over the third structure.

4. The semiconductor substrate according to claim 3, vias of the circuit layer of the first structure and vias of another one circuit layer of the third structure with taper down shape away from the glass layer.

5. The semiconductor substrate according to claim 3, a pitch of an outer layer of the third structure is finer than a pitch of an outer layer of the first structure.

6. The semiconductor substrate according to claim 1, wherein a size of the vertical conductive connector is smaller than a size of the through hole, such that a gap is located between the vertical conductive connector and the glass layer.

7. The semiconductor substrate according to claim 1, further comprising: a buffer layer located between the vertical conductive connector and the through hole.

8. The semiconductor substrate according to claim 7, wherein materials of the buffer layer comprise hole plugging material.

9. The semiconductor substrate according to claim 7, wherein the through hole is filled up with the vertical conductive connector and the buffer layer.

10. The semiconductor substrate according to claim 7, wherein sidewalls of the vertical conductive connector are covered by the buffer layer, the adhesive layer, and a dielectric layer of the circuit layer.

11. The semiconductor substrate according to claim 7, wherein the vertical conductive connector is surrounded by the buffer layer.

12. The semiconductor substrate according to claim 11, wherein a bottom part of the vertical conductive connector is surrounded by the adhesive layer.

13. The semiconductor substrate according to claim 7, wherein a top surface of the vertical conductive connector, a top surface of the buffer layer, and a top surface of the glass layer are coplanar.

14. The semiconductor substrate according to claim 1, wherein the adhesive layer has a buffer stress function.

15. The semiconductor substrate according to claim 1, further comprising: a pad electrically connected to the circuit layer through the vertical conductive connector, wherein the pad is directly in electrical contact with the vertical conductive connector and covers the through hole and parts of a top surface of the glass layer.

16. The semiconductor substrate according to claim 1, further comprising: a via electrically connected to the circuit layer through the vertical conductive connector, wherein the via is directly in contact with the vertical conductive connector and the glass layer physically separated from the vertical conductive connector.

17. The semiconductor substrate according to claim 1, further comprising an extra connector layer having an outer ring surface and located on the through hole.

18. The semiconductor substrate according to claim 17, wherein the extra connector layer is located beside the vertical conductive connector, and the extra connector layer is connected to ground or delivers a signal.

19. The semiconductor substrate according to claim 17, further comprising: a group of vias electrically connected to the circuit layer through the vertical conductive connector, wherein the vias is directly in contact with the vertical conductive connector or the extra connector layer.

20. The semiconductor substrate according to claim 17, wherein the outer ring surface and the vertical conductive connectors acts as a capacitor with a dielectric constant higher than 10.

* * * * *